United States Patent
Hansen et al.

(10) Patent No.: US 11,581,853 B2
(45) Date of Patent: Feb. 14, 2023

(54) WIDEBAND FILTER FOR DIRECT CONNECTION TO DIFFERENTIAL POWER AMPLIFIER

(71) Applicant: Avago Technologies International Sales Pte. Limited, Singapore (SG)

(72) Inventors: Sean Thomas Hansen, Sunnyvale, CA (US); Jeesu Kim, San Jose, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 17/160,293

(22) Filed: Jan. 27, 2021

(65) Prior Publication Data

US 2022/0239257 A1    Jul. 28, 2022

(51) Int. Cl.
| | |
|---|---|
| H03F 1/02 | (2006.01) |
| H04B 1/04 | (2006.01) |
| H03F 3/45 | (2006.01) |
| H03H 9/70 | (2006.01) |
| H03H 9/72 | (2006.01) |

(52) U.S. Cl.
CPC ........... *H03F 1/02* (2013.01); *H03F 3/45475* (2013.01); *H04B 1/04* (2013.01); *H03F 2200/09* (2013.01); *H03F 2200/171* (2013.01); *H03F 2200/387* (2013.01)

(58) Field of Classification Search
None
See application file for complete search history.

(56) References Cited

U.S. PATENT DOCUMENTS

| | | | | |
|---|---|---|---|---|
| 4,205,284 A * | 5/1980 | Bouchou | ............... | H03H 9/542 |
| | | | | 333/189 |
| 4,395,688 A * | 7/1983 | Sellers | ................. | H03H 7/1791 |
| | | | | 333/176 |
| 5,991,172 A * | 11/1999 | Jovanovic | ........... | H02M 1/4258 |
| | | | | 363/21.14 |
| 6,714,099 B2 * | 3/2004 | Hikita | ...................... | H03H 9/70 |
| | | | | 333/133 |
| 6,963,257 B2 * | 11/2005 | Ella | ........................ | H03H 9/706 |
| | | | | 333/192 |
| 7,038,551 B2 * | 5/2006 | Kearns | ..................... | H03H 9/72 |
| | | | | 331/133 |
| 7,471,524 B1 * | 12/2008 | Batarseh | ........... | H02M 3/33592 |
| | | | | 363/90 |

(Continued)

OTHER PUBLICATIONS

Kinsman, "A History of Crystal Filters," 1998 IEEE International Frequency Control Symposium, 8 pages.

*Primary Examiner* — Pablo N Tran
(74) *Attorney, Agent, or Firm* — BakerHostetler

(57) ABSTRACT

A filter device configured to directly connect to a differential power amplifier of a transmit chain circuit. The filter device may include a transformer and a filter configured as a half lattice equivalent topology and having a single-ended output. The filter may be a lattice filter configured as a full lattice topology or a lattice equivalent filter configured as a half lattice equivalent topology. The filter includes a first branch having a first impedance network of one or more first impedance elements and a second branch having a second impedance network of one or more second impedance elements. The single-ended output of the filter device may connect to an antenna switch that is in turn connected to an antenna.

14 Claims, 12 Drawing Sheets

(56) References Cited

U.S. PATENT DOCUMENTS

| | | | | |
|---|---|---|---|---|
| 7,659,795 B2* | 2/2010 | Hikita | ................... | H03H 9/725 |
| | | | | 333/132 |
| 8,063,718 B2* | 11/2011 | Ueda | ...................... | H04B 1/18 |
| | | | | 333/133 |
| 2003/0128081 A1* | 7/2003 | Ella | ...................... | H03H 9/589 |
| | | | | 333/133 |
| 2005/0212619 A1* | 9/2005 | Aigner | ................ | H03H 9/0095 |
| | | | | 333/189 |

* cited by examiner

Filter Differential Response

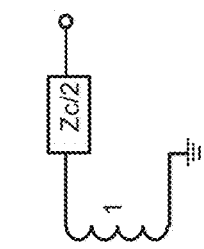
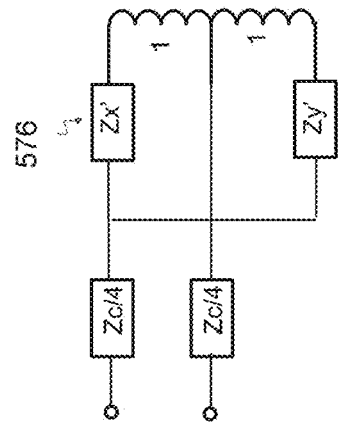
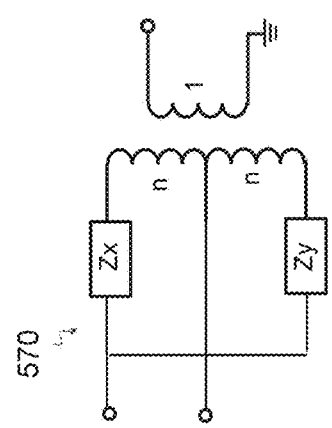
FIG. 14
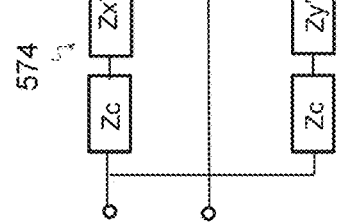
FIG. 15
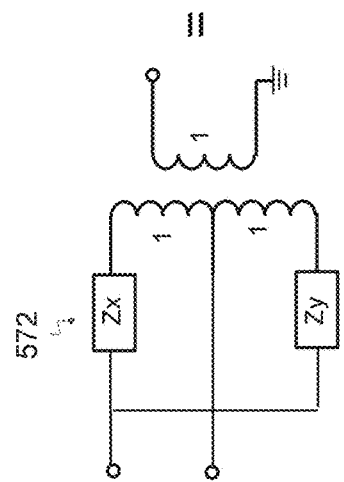

… (1)

WIDEBAND FILTER FOR DIRECT CONNECTION TO DIFFERENTIAL POWER AMPLIFIER

The present description relates in general to wireless communication systems, and in particular power amplifier and filter combinations.

BACKGROUND

A power amplifier combined with a frequency filter forms a key building block in wireless communication systems. The transmit chain of such a system combines a power amplifier with a filter to suppress unwanted spectral frequencies, with optional switches on either side of the filter, so that a single antenna or single power amplifier can optionally connect to multiple filters. Many commonly used power amplifier designs have differential outputs, meaning the signals at the output ports are roughly 180 degrees out of phase. Because most switch and antenna implementations are single-ended, and because the most common filter implementations are single-ended ladder structures, the output of the power amplifier often connects to a transformer, which acts as a balun to convert differential (e.g., balanced) signals to single-ended (e.g., unbalanced) signals used by switches, filters, and the antenna. Furthermore, the output impedance of the power amplifier is usually quite low, on the order of a few ohms or tens of ohms. This impedance must be matched to higher impedances, often near 50 ohms to interface with typical switches, filters, and antennas. The impedance conversion can be accomplished with a matching network of transmission lines or discrete inductors and capacitors.

Unfortunately, the transformer balun and impedance matching; circuits required after the power amplifier may attenuate the power amplifier output by more than 1 decibel (dB), in addition to the 1.5 to 2 dB losses incurred by the filter, for a total loss of approximately 2.5 to 3 dB between power amplifier and filter output, not counting any additional losses from switches. This added power dissipation increases the power required for transmitting signals from the antenna, thereby reducing the battery life in portable wireless devices.

BRIEF DESCRIPTION OF THE DRAWINGS

Certain features of the subject technology are set forth in the appended claims. However, for purposes of explanation, several embodiments of the subject technology are set forth in the following figures.

FIG. 14 is a schematic diagram illustrating an example filter topology, according to aspects of the disclosure.

FIG. 15 is a schematic diagram illustrating example network topologies, according to aspects of the disclosure.

DETAILED DESCRIPTION

Figure 1:
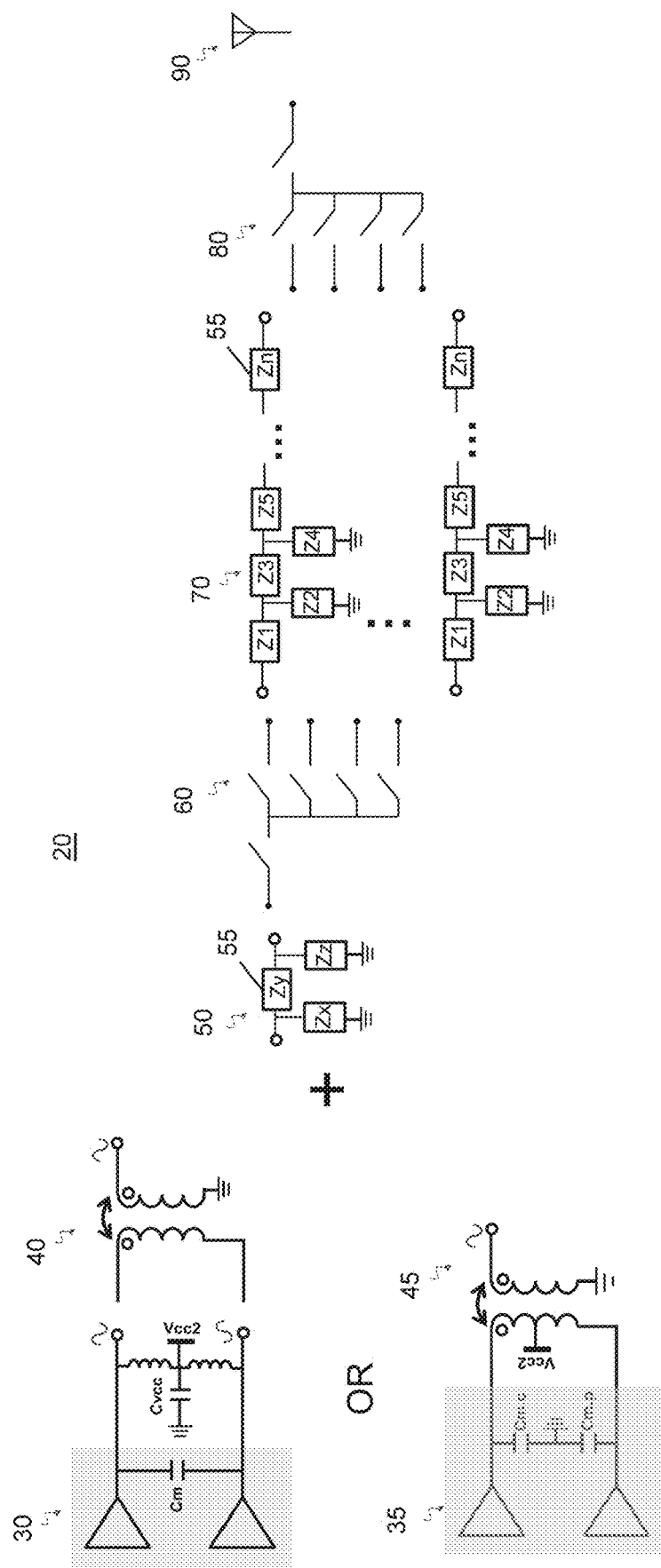
FIG. 1 is a schematic diagram illustrating an example common topology for a transmit chain with multiple filters that connect to a differential power amplifier.

The detailed description set forth below is intended as a description of various configurations of the subject technology and is not intended to represent the only configurations in which the subject technology may be practiced. The appended drawings are incorporated herein and constitute part of the detailed description, which includes specific details for providing a thorough understanding of the subject technology. However, the subject technology is not limited to the specific details set forth herein and may be practiced without one or more of the specific details. In some instances, structures and components are shown in a block-diagram form in order to avoid obscuring the concepts of the subject technology.

In certain applications where a single power amplifier connects to a single filter that is only used for transmit (e.g., uplink), no switch is necessary between the power amplifier and filter. Rather than implementing a balun to convert differential power amplifier output to a single-ended signal and inserting matching components to raise the impedance to match the filter input impedance, a filter may be directly connected to the differential output of the power amplifier.

One differential filter topology, called a lattice filter, is a bridge circuit that has both differential inputs and outputs. This filter topology can be converted to a "hybrid-lattice" or "half-lattice" equivalent circuit using a transformer, typically with equal windings or turns in each transformer section. The transformer allows one or both ports of the filter to have a ground reference, converting to a single-ended design. By also varying the turns-ratio of the transformer, the impedance conversion ratio can be varied, so that one side of the filter can have different effective input impedance from the other. This topology has the flexibility to accommodate the impedance transformation functions and the conversion from differential signals from the power amplifier to single-ended signals needed for the antenna connection or other switches near the antenna.

Simulation using film bulk acoustic resonators (FBARs) as filtering elements suggest that the insertion loss is much improved by combining the balun, impedance conversion, and filtering functions in a single filter of this topology, when compared to the common approach of inserting a single-ended ladder filter after the power amplifier balun and impedance matching elements. A simulated example suggests an insertion loss of 2 dB for the combined filter, balun, and impedance matching functions, compared to 2.5-3 dB of loss for traditional methods. The implementation may also be more area-efficient, as very few components are needed in its implementation. The area savings and power savings could prove useful for many years to come as radio frequency (RF) front-end modules continue to shrink in size, and developers of portable wireless communication devices require lower power consumption for longer battery life.

The subject technology proposes solutions for direct connection between a differential power amplifier and a filter. Here, only a single filter connects to the power amplifiers, so there is no intervening switch (e.g., band-select switch or transmit-receive switch) between the filer and power amplifier. However, there may be switches at one or more antennas to connect to other filters and amplifiers, such as transmit (TX) or receive (RX).

According to aspects of the subject technology, a transmit chain circuit device is configured to include a differential power amplifier, a filter device directly coupled to the differential power amplifier, and an antenna coupled to the filter device. The filter device has a single-ended output and may include a filter having multiple impedance elements and a transformer balun.

According to aspects of the subject technology, a filter device is configured to directly connect to a differential power amplifier of a transmit chain circuit. The filter device may include a transformer and a lattice equivalent filter configured as a half lattice equivalent topology and having a single-ended output. The lattice equivalent filter includes a first branch having a first impedance network of one or more first impedance elements and a second branch having a second impedance network of one or more second impedance elements.

According to aspects of the subject technology, a filter device may be configured to directly connect to a differential power amplifier of a transmit chain circuit. The filter device may include a transformer and a lattice filter configured as a full lattice topology and having a single-ended output. The lattice filter includes a matching network configured to provide impedance transformation and a single-ended filter.

Figure 5:
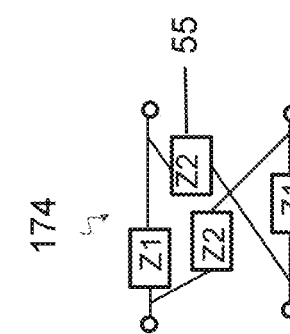
FIG. 5 is a schematic diagram illustrating an example of a lattice filter, according to aspects of the disclosure.

In aspects of the disclosure as discussed above, a lattice filter may include a first branch having a first impedance network of one or more first impedance elements and a second branch having a second impedance network of one or more second impedance elements. Further, multiple lattice topologies, containing different impedances in first and second branches, can be cascaded within a single filter. For example, two or more of the filters shown in FIG. 5 may be connected (e.g., cascaded).

FIG. 1 illustrates an example common topology for a transmit chain 20 with a differential power amplifier 30. The transmit chain 20 includes the differential power amplifier 30 and a transformer balun 40 to convert the differential power amplifier 30 to single-ended. A matching network 50 (e.g., matching and tuning network) is used to transform low impedance to about 50 ohms. The matching network 50 is formed from multiple impedance elements 55, where each impedance element 55 may include any combination of inductors, capacitors, transmission lines, resonators, crystals, and/or FBARs. A switch 60 (e.g., band select switch) couples the matching network 50 to multiple single-ended filters 70, which in turn couple to an antenna switch 80, which in turn couples to an antenna 90. Differential power amplifier 35 and transformer balun 45 may be used instead of differential power amplifier 30 and transformer balun 40. FIG. 1 illustrates one signal path between the differential power amplifier 30, 35 and the antenna 90, though many RF front-end modules have multiple differential power amplifiers 30, 35 and multiple antennas 90.

While switch 60 is shown in FIG. 1 as a band select switch where a single multi-band power amplifier 30, 35 can connect to multiple filters 70, switch 60 may be any suitable switching configuration between a power amplifier and a filter. For example, a power amplifier (e.g., differential power amplifier 30, 35) may connect to only a single filter (e.g., filter 70), which is used for both transmit/uplink and receive/downlink, where the switch 60 may be a transmit-receive (TRX) switch. For example, for a TRX switch the pole may connect to the filter (e.g., filter 70) and the throws may connect to power amplifiers (e.g., differential power amplifier 30, 35) for transmit or low-noise amplifiers (LNA) for receive.

Figure 2:
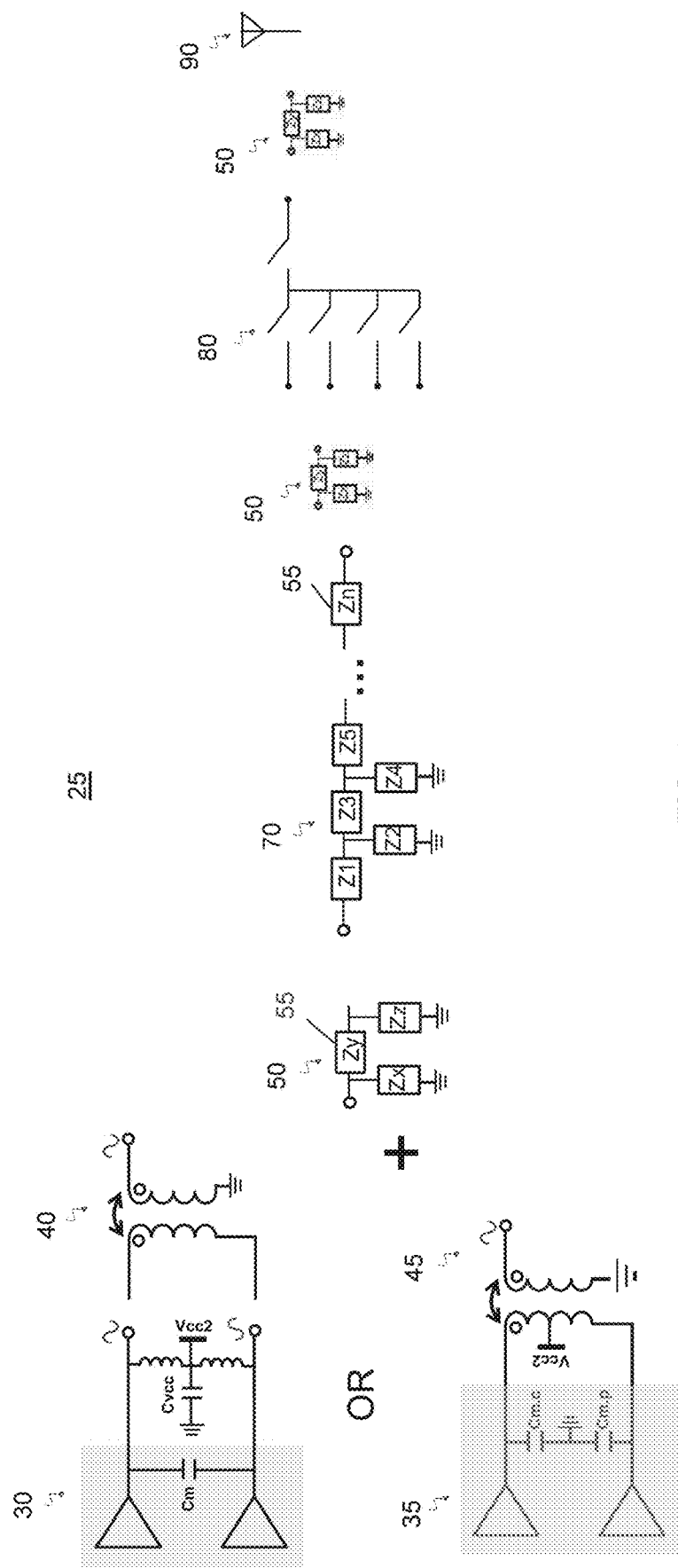
FIG. 2 is a schematic diagram illustrating an example common topology for a differential power amplifier connected to a dedicated filter.

FIG. 2 illustrates an example common topology for a transmit chain 25 having a differential power amplifier 30, 35 connected to a dedicated filter 70. The differential power amplifier 30 and transformer balun 40 or the differential power amplifier 35 and transformer balun 45 may be coupled to the same matching network 50 as in the transmit chain 20. However, the matching network 50 is then coupled directly to a single dedicated filter 70. Here, there is no switch 60 because only a single filter 70 connects to the differential power amplifier 30, 35 for a dedicated uplink path. The single filter 70 is coupled to the antenna switch 80, which is coupled to the antenna 90.

Additional matching networks 50 may be coupled between the single filter 70 and the antenna switch 80 and/or between the antenna switch 80 and the antenna 90. These additional matching networks 50 may be used for impedance matching (e.g., to offset capacitive parasitic of the antenna switch 80) and/or additional filtering (e.g., harmonic traps to remove high-order harmonics from the differential power amplifier 30, 35 output), and may be implemented as any of a pi network, an L network and a T network, for example. While there is no switch 60 between the filter and power amplifier here, there can still be other switches at one or more antennas 90 to connect to other filters and amplifiers (e.g., TX, RX). Also, though there is no switch 60 and there is only one dedicated filter 70, the transformer balun 40, 45, matching network 50 and filter components (e.g., impedance elements 55) add significant dissipative loss to the signals.

Figure 3:
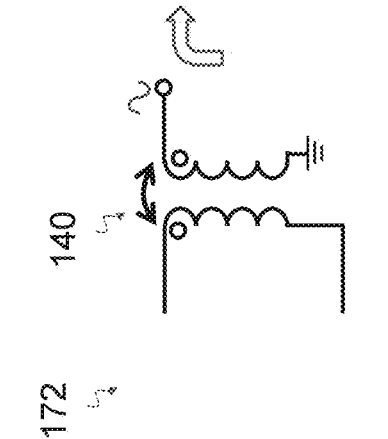
FIG. 3 is a schematic diagram illustrating an example differential power amplifier with a transformer balun, according to aspects of the disclosure.
Figure 3:
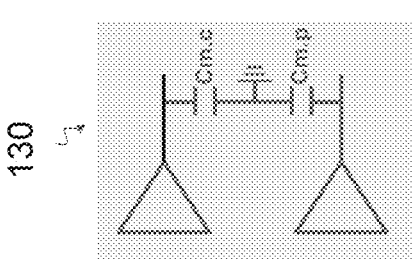
Figure 3:
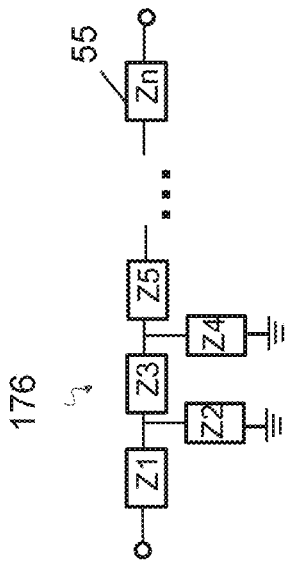
Figure 4:
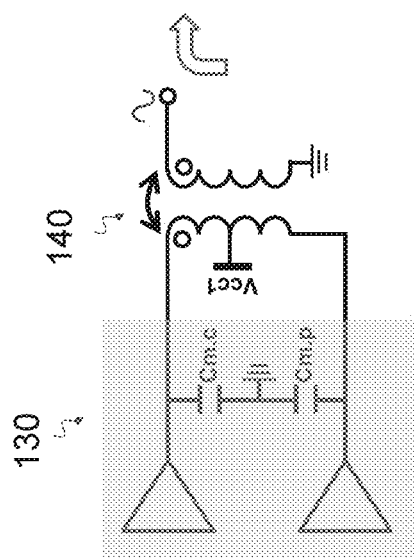
FIG. 4 is a schematic diagram illustrating an exploded view of the differential power amplifier of FIG. 3, according to aspects of the disclosure.

FIGS. 3 and 4 illustrate an example power amplifier 130 and transformer 140, according to aspects of the disclosure, where in FIG. 4 a filter area 172 is disposed between the power amplifier 130 and the transformer 140. The filter area 172 represents bringing the filtering further back in a transmit chain (e.g., transmit chain 20, 25), such as before the transformer 140 as shown in FIG. 4. In aspects of the disclosure, the transformer 140 may be incorporated as part of a filter.

Many different filtering topologies, such as lattice filters and their equivalents, are capable of very wide filtering bandwidths and excellent wideband rejection using very few components compared to commonly used half-ladder topologies. For example, a lattice filter 174 is shown in FIG.

Figure 6:
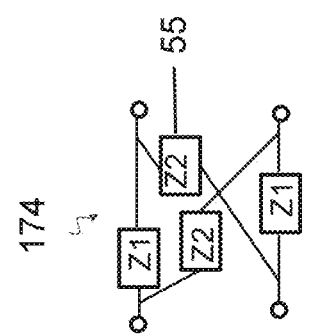
FIG. 6 is a schematic diagram illustrating an example half-ladder filter topology, according to aspects of the disclosure.
Figure 7:
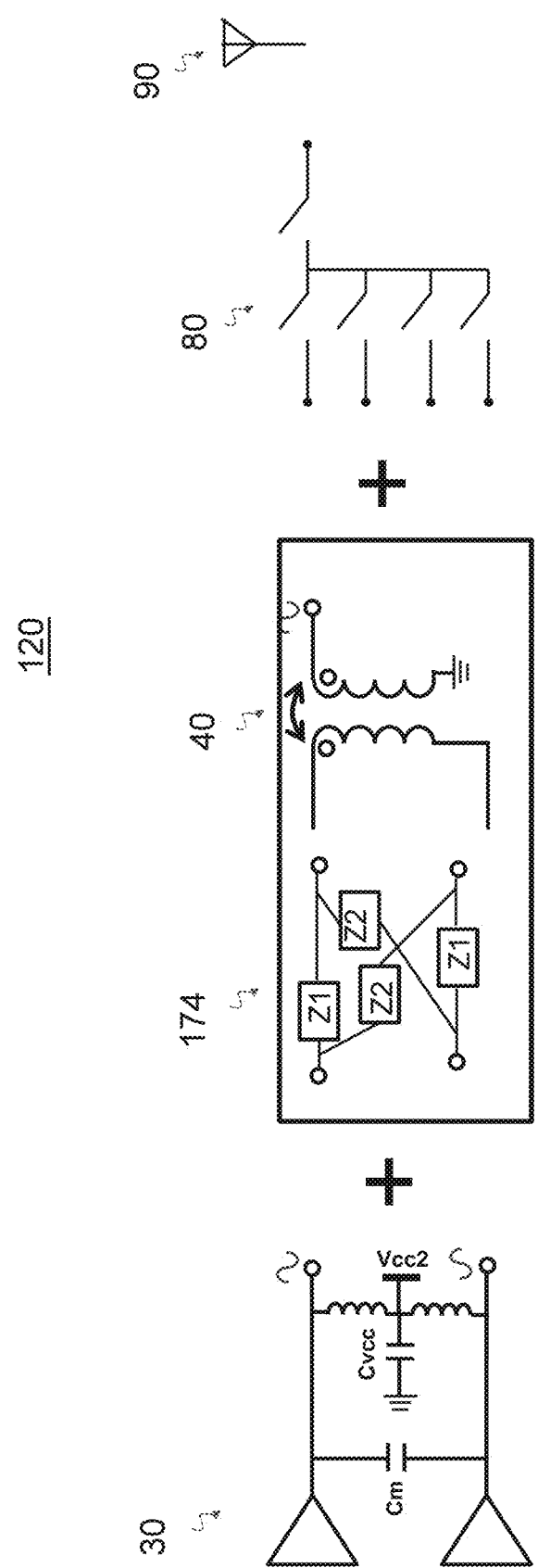
FIG. 7 is a schematic diagram illustrating an example transmit chain, according to aspects of the disclosure.

5 and is formed from multiple impedance elements 55. Lattice filter 174 is suitable for balanced/differential connections. As shown in FIG. 6, a half ladder 176 is also formed from multiple impedance elements 55. Half ladder 176 is suitable for unbalanced, single-ended connections FIG. 7 shows an example transmit chain 120 that incorporates this concept of bringing the filtering back in the chain between the differential power amplifier 30 and the transformer balun 40 from transmit chain 20 shown in FIG. 1, Transmit chain 120 allows for a direct connection between the differential power amplifier 30 and the filter 174. The filtering is shown as a lattice filter 174 representing a full lattice topology, but other filtering topologies that support differential input and output signals are possible. The transmit chain 120 also includes the antenna switch 80 and the antenna 90 from transmit chain 20. Here, there is no switch 60 because only a single filter 174 connects to the differential power amplifier 30. There may be switches at one or more antennas 90 to connect to other filters and amplifiers (e.g., TX, RX), In addition, the boxed area shown in FIG. 7 combines the functions of the filter 70, the transformer balun 40 and the matching network 50 (e.g., impedance conversion) from the transit chain 20. In aspects of the disclosure, the antenna switch 80 may be omitted and the antenna 90 coupled to the output of the boxed area.

Figure 8:
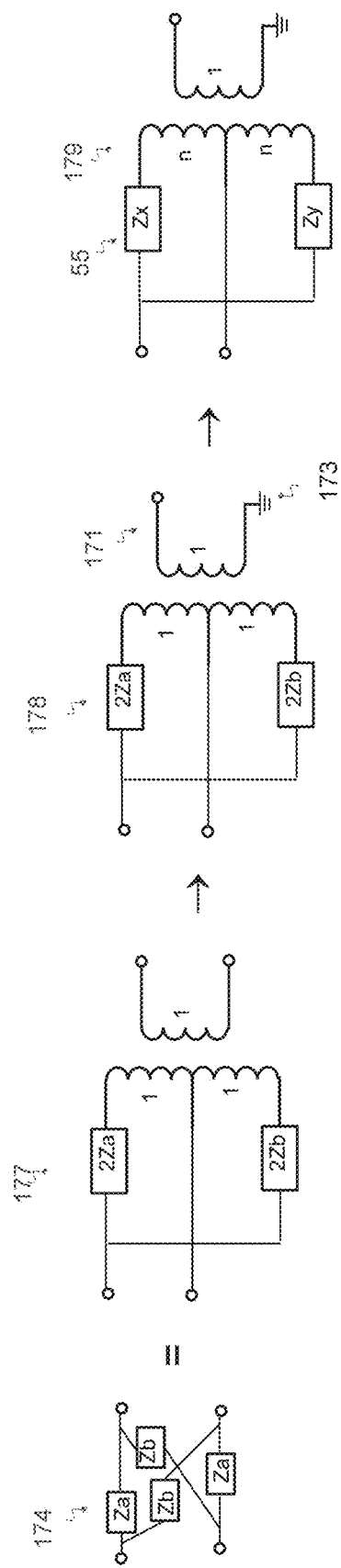
FIG. 8 is a schematic diagram illustrating an example filter topology, according to aspects of the disclosure.

In aspects of the disclosure, the filtering may be transformed into other equivalents, such as a half-lattice or hybrid lattice as shown in FIG. 8. For example, the full lattice topology of lattice filter 174 may be replaced by a half lattice equivalent network 177. The lattice filter 174 and the half lattice equivalent network 177 have differential input and output signals, which require identical port impedances due to symmetry. However, the half lattice equivalent network 177 may be transformed from a differential port to single-ended to yield filter 178. Here, isolating the transformer allows the application of a ground reference 173 for the single-ended connection 171. Thus, filter 178 is not burdened in the same manner as lattice filter 174 or half lattice equivalent network 177 regarding the output signals.

Impedance transformation is possible with an n=1 turns ratio with appropriately chosen impedance values for Za and Zb. In aspects of the disclosure, an addition of arbitrary turns ratio n adjustments provides for adjustable filter 179, as shown in FIG. 8. For adjustable filter 179, arbitrary turns ratio n and adjustments to impedance elements 55 (e.g., impedance blocks) helps filter to transform impedance levels. Thus, the arbitrary turns ratio n adds degrees of freedom for impedance transformation or optimization of the filter performance. In aspects of the disclosure, adjustable filter 179 has the flexibility to perform differential to single-ended conversion, and impedance transformation too, by varying the impedance elements 55 and transformer 140 transformation turns ratio n. Impedance elements 55 are networks containing any combination of inductors, capacitors, resistors, transmission lines, crystals, or resonators. Thus, the changes to combine filtering, balun and impedance conversion functions allows for connecting directly to differential power amplifier 30, 35.

Figure 9:
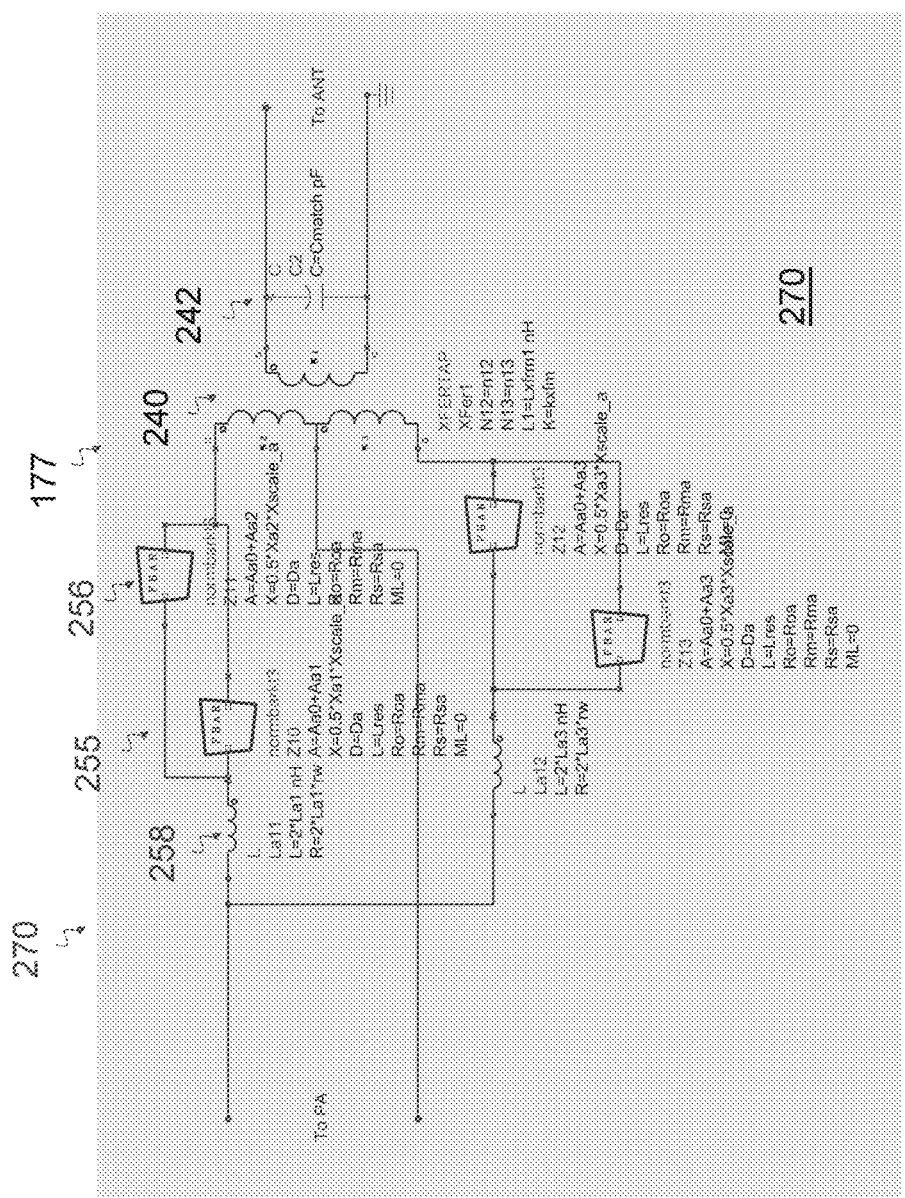
FIG. 9 is a schematic diagram illustrating an example filter topology, according to aspects of the disclosure.
Figure 9:
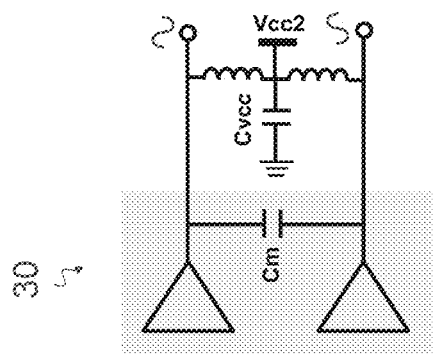

FIG. 9 illustrates an example filter 270 having a half-lattice equivalent 177 with a center-tapped transformer 240, where a well-designed transformer 240 offers common-mode rejection. For example, additional external matching components 242 may be used to obtain the desired transformer 240. Filter 270 includes two impedance elements 255, each impedance element 255 having two FBAR resonators 256 and one inductor 258. In aspects of the disclosure, impedance element 255 may be any combination of inductors, capacitors, resistors, crystals, or resonators. As shown, filter 270 may be directly coupled to differential power amplifier 30. In aspects of the disclosure, filter 270 may be directly coupled to differential power amplifier 35 or any other suitable differential power amplifier.

Figure 10:
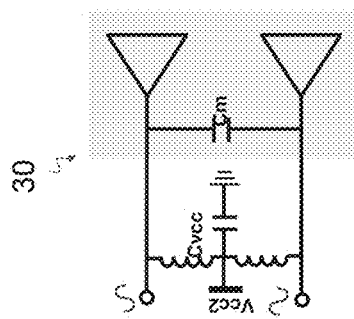
FIG. 10 is a schematic diagram illustrating a simulation of an example filter topology, according to aspects of the disclosure.
Figure 10:
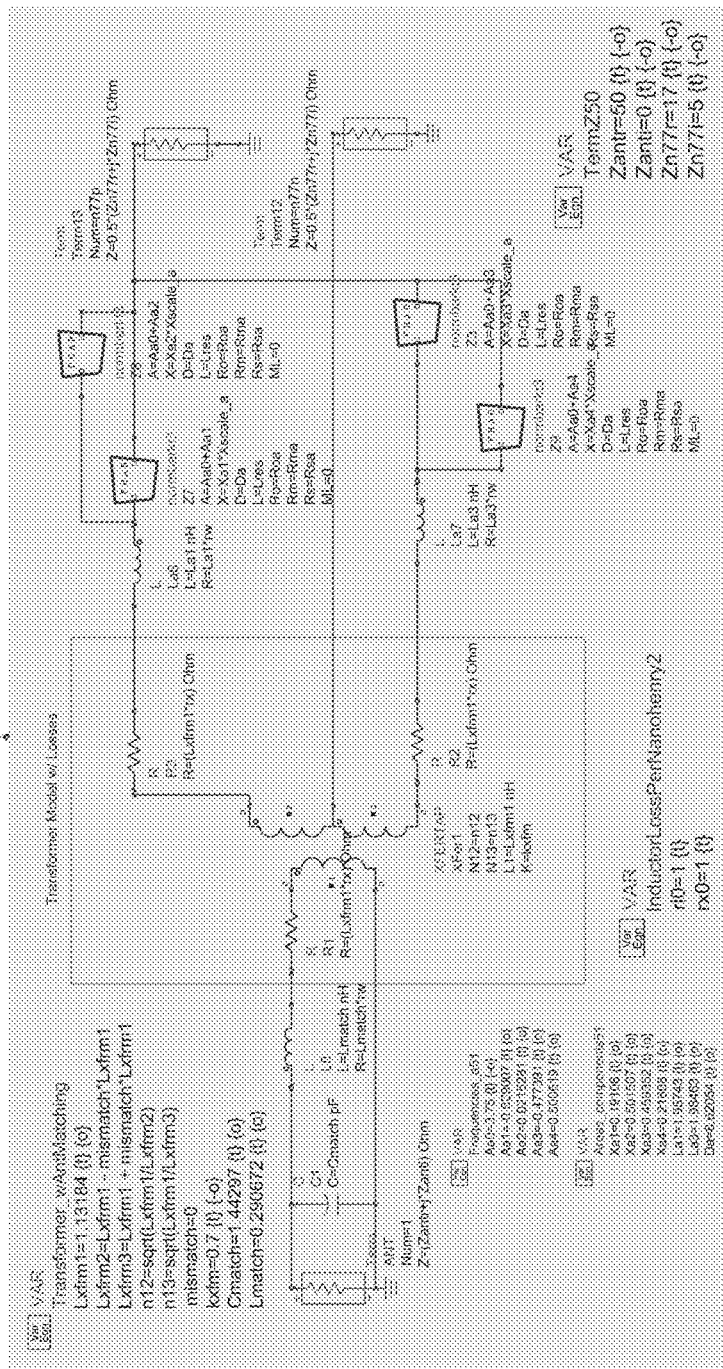

FIG. 10 shows a simulation example of a filter 370 (e.g., N77 filter) using an ideal center-tapped transformer. Here, differential ports connect directly to a differential power amplifier (e.g., differential power amplifier 30, 35) having differential impedance of 17+5*j ohms. On the other end, a single-ended port connects to an antenna (e.g., antenna 90) or antenna switches (e.g., antenna switch 80). For this simulation, the FBAR modified Butterworth-Van Dyke (MBVD) model loss assumptions are RO=0.3, Rm=0.5, Rs=0.8, Rp50~4000 ohms, Rs50~1.1 ohms, and an Ohm/nH losses for all printed circuit board (PCB) inductors.

Figure 11:
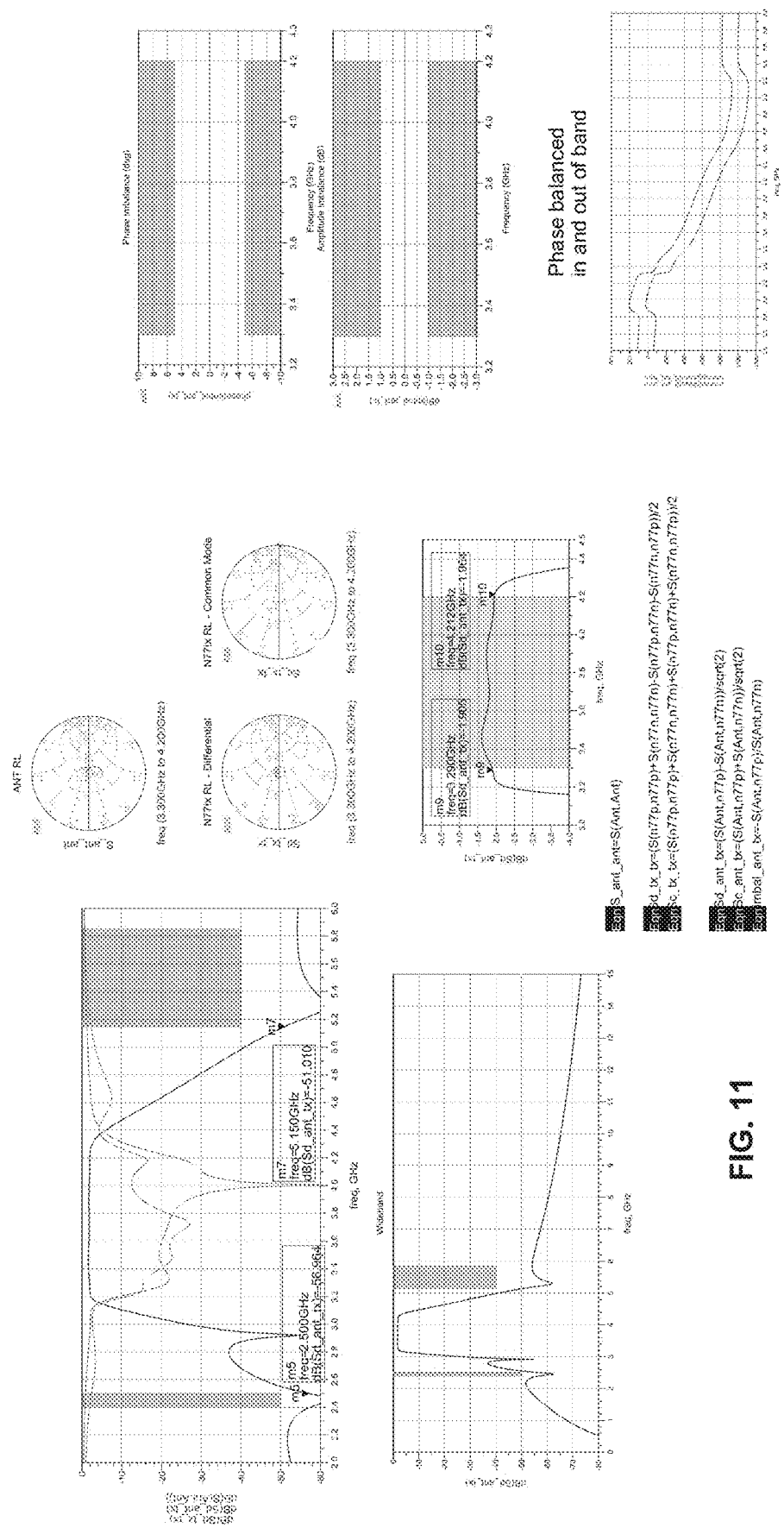
FIG. 11 is a schematic diagram illustrating the results of the simulation of FIG. 10, according to aspects of the disclosure.

FIG. 11 shows the results of the simulation using example filter 370 with an ideal center-tapped transformer of FIG. 10. Here, the ideal transformer is assumed to have perfectly matched phases and the shaded boxes indicate where rejection is needed.

Figure 12:
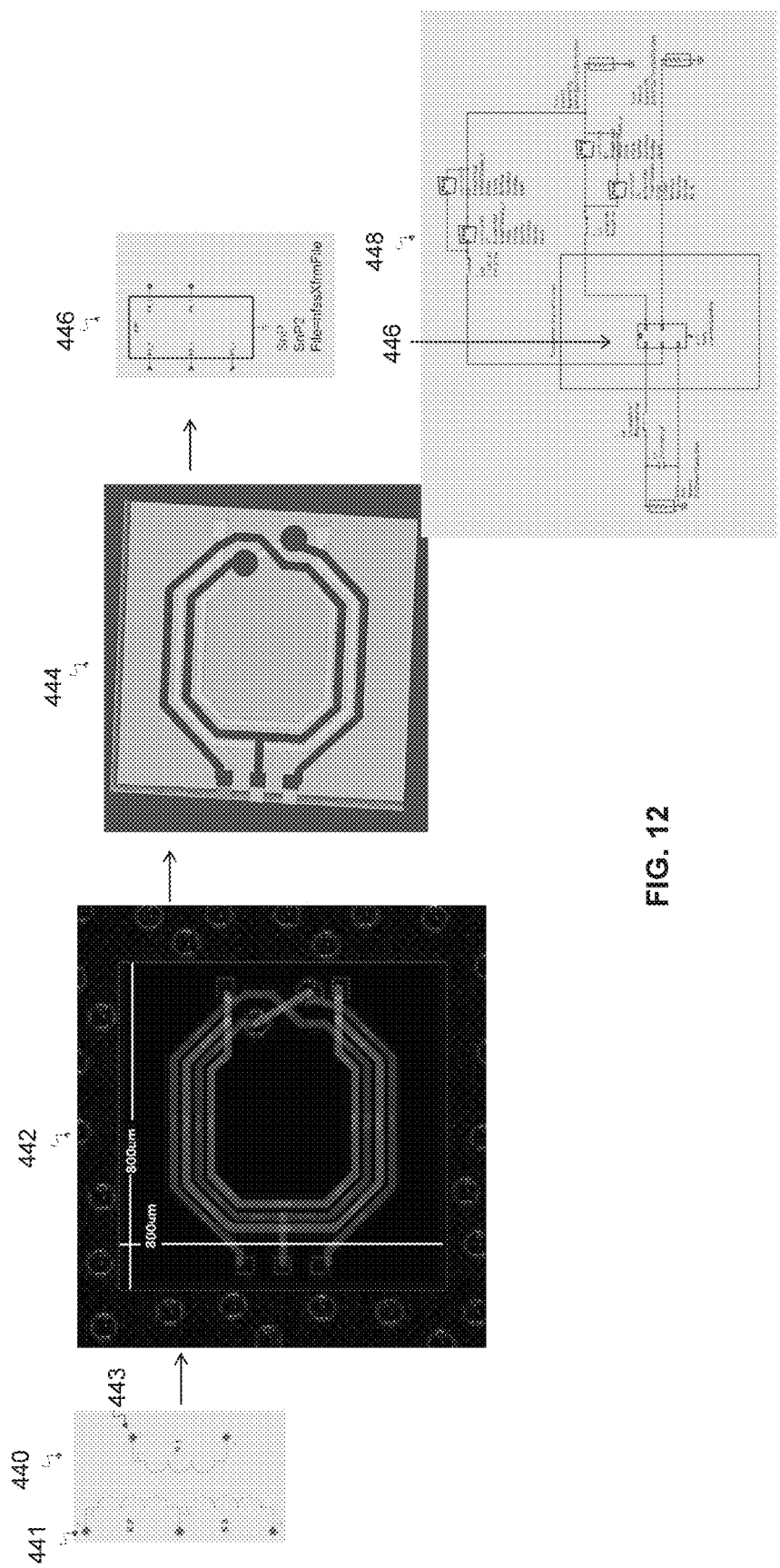
FIG. 12 is a schematic diagram illustrating a simulated PCB transformer layout, according to aspects of the disclosure.

FIG. 12 shows a simulation example using a simulated. PCB transformer 440 layout (e.g., non-ideal transformer) having secondary ports 441 and primary ports 443. Here, the PCB layout area 442 for the transformer 440 used in the filter (e.g., filter 370) is comparable to typical transformer baluns (e.g. transformer balun 40) used at the output of the differential power amplifier. A simulation model 444 includes surface roughness losses. A resulting SSP file 446 is used as an SSP block in a circuit simulation 448, As shown in the circuit simulation 448, the FBAR filtering, which is based on an efficient lattice implementation is quite area-efficient, requiring only a few resonators.

Figure 13:
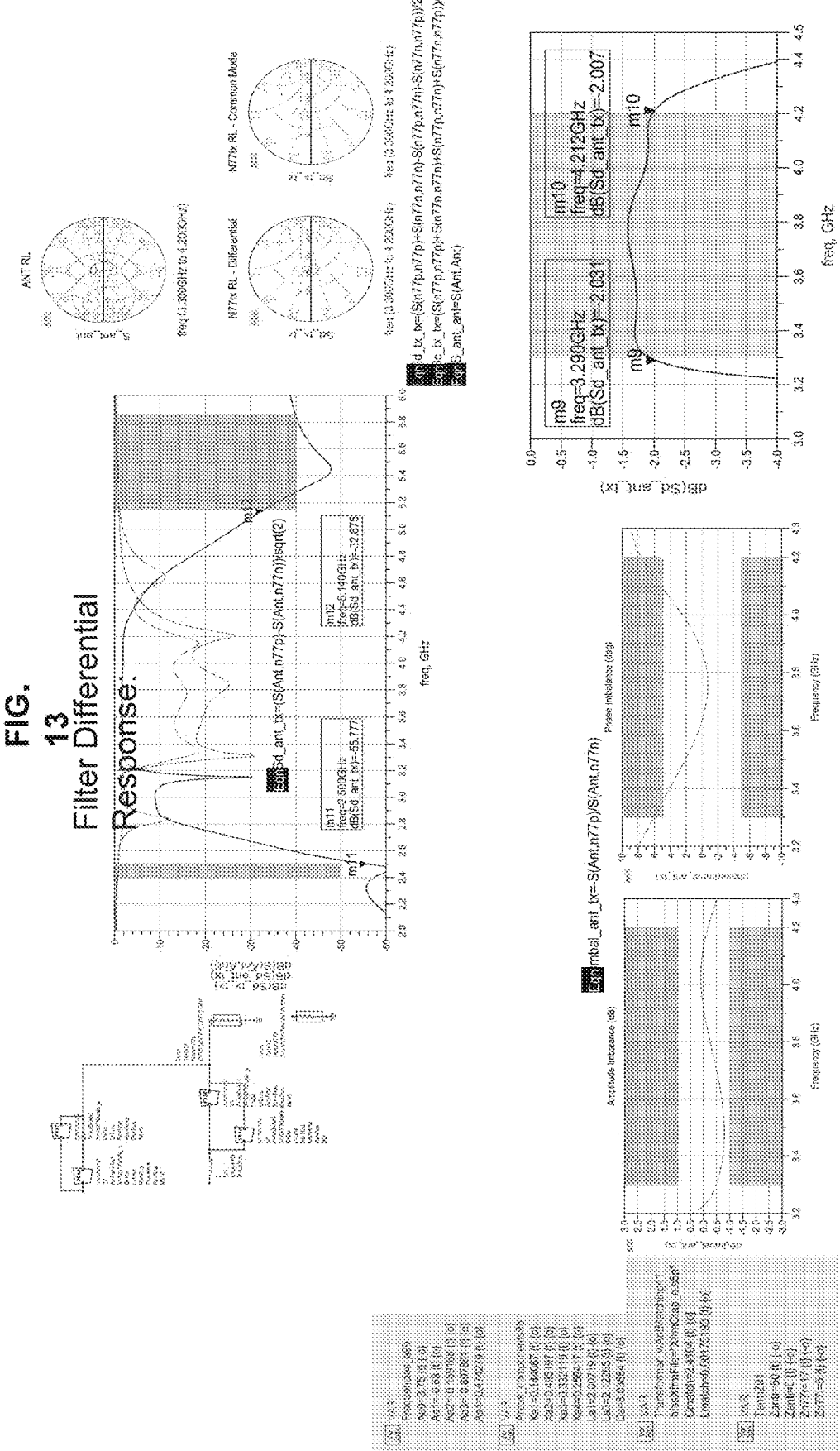
FIG. 13 is a schematic diagram illustrating the results of the simulation of FIG. 12, according to aspects of the disclosure.

FIG. 13 shows a simulation example of filter 370 reoptimized with the simulated PCB transformer 440 of FIG. 12. The filter design, using this non-ideal transformer 440, which is more realistic in application than the ideal transformer of FIG. 10, has phase and amplitude that are no longer perfectly balanced (e.g., + or −5 degrees), yet still able to get a good degree of rejection. This not perfectly balanced transformer 440 may be suitable if the layout is symmetric and process variations are well-controlled. In the simulation, the insertion loss is good (e.g., 2 dB) based on combining multiple functions in one block.

In aspects of the disclosure, there are several possible impedance elements for a filter, such as filter 570 shown in FIG. 14. Here, the impedances Zx and Zy in each branch determine the frequency response of the filter 570, For example, depending on the phase responses of the impedances Zx and Zy, the structure can implement bandpass, bandstop, low-pass, or high-pass filtering functions within a given frequency range. Also, the impedances Zx and Zy may include any network combination of elements. For example, reactive elements such as inductors and capacitors, or dissipative elements such as resistors, which may be implemented on PCB, integrated passive device (IPD), integrated circuit (IC) process, low-temperature co-fired ceramic (LTCC) substrates, or discrete components, such as surface-mount devices (SMD). Combinations of the above components may be used to create resonant structures.

As another example, combinations of electromechanical or acoustic resonators may be used. These may include bulk-acoustic wave (BAW) resonators, FBAR, surface acoustic wave (SAW) resonators, or crystals that have been cut to function as resonators (crystal resonators). For better power-handling or reduction or to suppress second-order non-linearities, resonators may be connected in parallel (e.g., split-bar) or in series (e.g., power-bar) forms. In yet another example, active circuitry may be used, such as transistors or amplifiers combined with passive elements to create impedances with the desired impedance and phase response for the filter 570.

If the impedances Zx and Zy share a common impedance Zc connected in series (or shunt) position, that component can be moved to the external terminals in a series (or shunt) position with appropriate impedance scaling factors. As an example, equivalent networks 572, 574, 576 are shown in FIG. 15 for a common series impedance Zc and a filter implementation with n=1. When a non-ideal transformer is used (e.g., coupling coefficient k<1), when n≠1, or when parasitic elements are included, the scaling factors for the common impedance Zc will be different than shown in FIG. 15, or the network may not be exactly equivalent, but a similar concept still applies.

In aspects of the disclosure, implementation of the impedance Zc may be more convenient outside of Zx and Zy branches due to fabrication processes, or the impedance might be implemented with lower losses outside of the Zx and Zy branches. For example, in the filter designs shown in FIGS. 9-11, the inductance La1 could be removed from one branch (and also subtracted from La3 in the other branch), to be replaced as scaled inductors at the input and outputs of the filter. The networks 572, 574, 576 may be incorporated into any of the above-discussed implementations if allowing for arbitrary Zx and Zy networks and recognizing that additional electrical components can be cascaded at the input and output of the filter.

Figure 17:
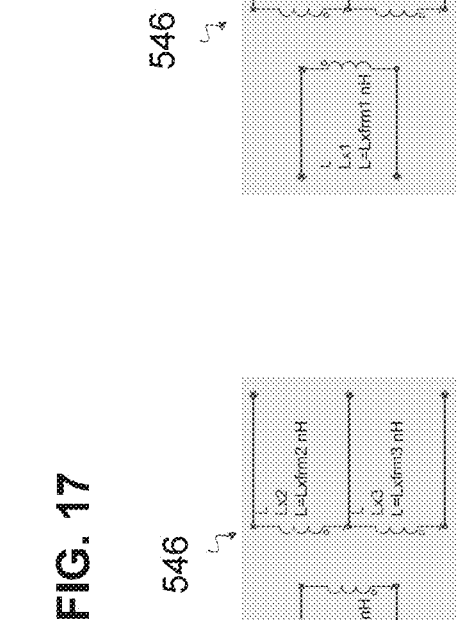
FIG. 17 is a schematic diagram illustrating example equivalent transformer and inductor topologies, according to aspects of the disclosure.
Figure 16:
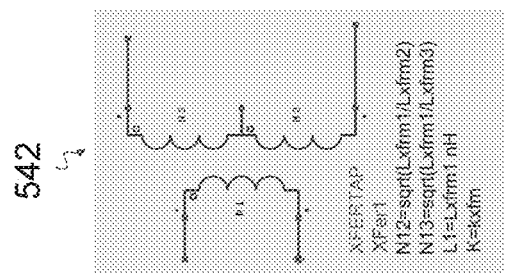
FIG. 16 is a schematic diagram illustrating an example transformer topology, according to aspects of the disclosure.
Figure 16:
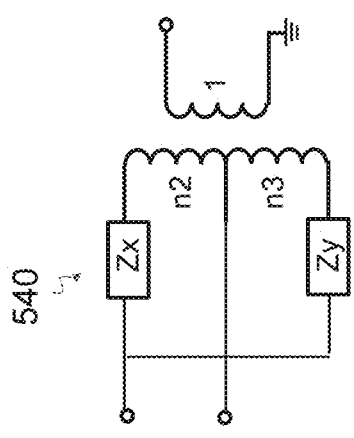

In aspects of the disclosure, there are several potential implementations of a center-tapped transformer 540, as shown in FIG. 16. The transformer 540 is effectively three inductors with coupled magnetic flux, as shown in FIG. 17 in the equivalent center-tapped transformer network 542 and mutually coupled inductor network 544, and may be implemented as such. For example, sufficient filter behavior may be obtained when turns ratios (e.g., n2 and n3) of the center-tapped transformer 542 or inductors Lx2 and Lx3 of mutually coupled inductor network 544 are not identical in value (e.g., the self inductances and the mutual inductances among the three inductors have different values). Simulation and optimization yield reasonable filter responses when Lx2 and Lx3 inductances (or ratios n2 and n3) are mismatched by a few percent, such as in a practical implementation where there is usually some mismatch. Likewise, the mutual coupling coefficient (e.g., kxfm) need not be ideal (e.g., near 1) or identical for the three inductors that comprise the transformer, as adjustments to Zx and Zy impedances can compensate for mismatch to still obtain reasonable filter responses. For example, the simulated PCB implementation of FIGS. 12 and 13 has an estimated coupling k~0.5, suggesting some flux leakage.

Figure 18:
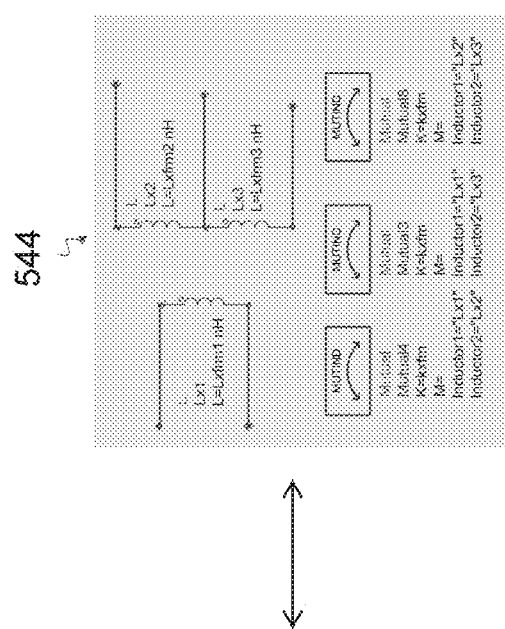
FIG. 18 is a schematic diagram illustrating example inductor dot orientations, according to aspects of the disclosure.

As shown in FIG. 18, the orientations (e.g., dot notation) 546 of the inductor windings may be flipped in certain ways. For example, the orientation of the Lx1 inductor does not matter and either terminal can serve as GND reference on the left port. Also, Lx2 & Lx3 can be flipped, as long as both are flipped together. Each of the examples shown in FIG. 17 are acceptable inductor orientations using mutually coupled inductor "dot" notation 546.

Implementations within the scope of the present disclosure can be partially or entirely realized using a tangible computer-readable storage medium (or multiple tangible computer-readable storage media of one or more types) encoding one or more instructions. The tangible computer-readable storage medium also can be non-transitory in nature.

The computer-readable storage medium can be any storage medium that can be read, written, or otherwise accessed by a general-purpose or special-purpose computing device, including any processing electronics and/or processing circuitry capable of executing instructions. For example, without limitation, the computer-readable medium can include any volatile semiconductor memory, such as RAM, DRAM, SRAM, T-RAM, Z-RAM and TTRAM. The computer-readable medium also can include any non-volatile semiconductor memory, such as ROM, PROM, EPROM, EEPROM, NVRAM, flash, nvSRAM, FeRAM, FeTRAM, MRAM, PRAM, CBRAM, SONGS, RRAM, NRAM, racetrack memory, FJG and Millipede memory.

Further, the computer-readable storage medium can include any non-semiconductor memory, such as optical disk storage, magnetic disk storage, magnetic tape, other magnetic storage devices, or any other medium capable of storing one or more instructions. In some implementations, the tangible computer-readable storage medium can be directly coupled to a computing device while, in other implementations, the tangible computer-readable storage medium can be indirectly coupled to a computing device, e.g., via one or more wired connections, one or more wireless connections, or any combination thereof.

Instructions can be directly executable or can be used to develop executable instructions. For example, instructions can be realized as executable or non-executable machine code or as instructions in a high-level language that can be compiled to produce executable or non-executable machine code. Further, instructions also can be realized as or can include data. Computer-executable instructions also can be organized in any format, including routines, subroutines, programs, data structures, objects, modules, applications, applets, functions, etc. As recognized by those of skill in the art, details including, but not limited to, the number, structure, sequence and organization of instructions can vary significantly without varying the underlying logic, function, processing and output.

While the above discussion primarily refers to microprocessor or multicore processors that execute software, one or more implementations are performed by one or more integrated circuits, such as application-specific integrated circuits (ASICs) or field-programmable gate arrays (FPGAs). In one or more implementations, such integrated circuits execute instructions that are stored on the circuit itself.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations or one or more configurations. A phrase such as "an aspect" may refer to one or more aspects and vice versa. A phrase such as "a configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "an example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the terms "include," "have," or the like are used in the description or the claims, such terms are intended to be inclusive in a manner similar to the term "comprise," as "comprise" is interpreted when employed as a transitional word in a claim.

Those of skill in the art would appreciate that the various illustrative blocks, modules, elements, components, methods and algorithms described herein may be implemented as electronic hardware, computer software, or combinations of both. To illustrate this interchangeability of hardware and software, various illustrative blocks, modules, elements, components, methods and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. A transmit chain circuit device comprising:
a differential power amplifier;
a filter device directly coupled to the differential power amplifier and having a single-ended output, the filter device configured as a half lattice equivalent network comprising:
a plurality of impedance elements; and
a transformer balun; and
an antenna coupled to the filter device, wherein the filter device is configured to transform impedance levels based on a turns ratio of the transformer balun and the plurality of impedance elements.

2. The transmit chain circuit device of claim 1, further comprising an antenna switch coupled to the filter device and to the antenna.

3. The transmit chain circuit device of claim 1, wherein the turns ratio is 1.

4. The transmit chain circuit device of claim 1, wherein the turns ratio is arbitrary.

5. The transmit chain circuit device of claim 1, wherein one or more of the plurality of impedance elements comprise a resonant structure formed from a combination of any of inductors, capacitors and resistors.

6. The transmit chain circuit device of claim 1, wherein one or more of the plurality of impedance elements comprise a combination of resonators formed from any of bulk-acoustic wave resonators, film bulk acoustic resonators, surface acoustic wave resonators and crystal resonators.

7. The transmit chain circuit device of claim 1, wherein one or more of the plurality of impedance elements comprise a combination of any of transistors and amplifiers with passive elements.

8. The transmit chain circuit device of claim 1, wherein the filter device comprises:
a first branch having a first impedance element network; and
a second branch having a second impedance element network, wherein the first and second impedance element networks each have a common impedance element connected in series, and wherein the common impedance elements are coupled to external terminals in a series position with impedance scaling factors.

9. The transmit chain circuit device of claim 1, wherein the transformer balun comprises a center-tapped transformer, and wherein two turns ratios of the center-tapped transformer have different values.

10. The transmit chain circuit device of claim 1, wherein the transformer balun comprises a mutually coupled inductor network comprising three inductors with coupled magnetic flux, and wherein the self inductances and the mutual inductances among the three inductors have different values.

11. A filter device for a transmit chain circuit, the filter device comprising:
a transformer; and
a plurality of impedance elements,
wherein the filter device is configured as a half lattice equivalent network having a single-ended output, the half lattice equivalent network comprising:
a first branch having a first impedance network of one or more first impedance elements of the plurality of impedance elements; and
a second branch having a second impedance network of one or more second impedance elements of the plurality of impedance elements,
wherein:
the filter device is configured to directly couple to a differential power amplifier, and
the first and second impedance networks each have a common impedance element connected in series, and wherein the common impedance element is coupled to external terminals in a series position with impedance scaling factors.

12. The filter device of claim 11, wherein each of the first and second branches has an arbitrary turns ratio, and wherein the filter device is configured to transform impedance levels based on the arbitrary turns ratio and adjustments to the first and second impedance networks.

13. The filter device of claim 11, wherein the transformer comprises a center-tapped transformer, and wherein first and second turns ratios of the center-tapped transformer have different values.

14. The filter device of claim 11, wherein the transformer comprises a mutually coupled inductor network comprising three inductors with coupled magnetic flux, and wherein the self inductances and the mutual inductances among the three inductors have different values.

* * * * *